US009791493B2

(12) United States Patent
Bandyopadhyay et al.

(10) Patent No.: US 9,791,493 B2
(45) Date of Patent: Oct. 17, 2017

(54) SENSOR FAULT DETECTION SYSTEM AND METHOD

(71) Applicant: ANALOG DEVICES, INC., Norwood, MA (US)

(72) Inventors: Abhishek Bandyopadhyay, Burlington, MA (US); Khiem Quang Nguyen, Tewksbury, MA (US)

(73) Assignee: Analog Devices, Inc., Norwood, MA (US)

( * ) Notice: Subject to any disclaimer, the term of this patent is extended or adjusted under 35 U.S.C. 154(b) by 1042 days.

(21) Appl. No.: 13/747,250

(22) Filed: Jan. 22, 2013

(65) Prior Publication Data
US 2013/0207665 A1    Aug. 15, 2013

Related U.S. Application Data

(60) Provisional application No. 61/597,531, filed on Feb. 10, 2012.

(51) Int. Cl.
*G01R 31/02*    (2006.01)
*H04R 29/00*    (2006.01)
(Continued)

(52) U.S. Cl.
CPC ............... *G01R 31/02* (2013.01); *G01D 3/10* (2013.01); *H04R 29/004* (2013.01);
(Continued)

(58) Field of Classification Search
CPC ...... G01R 31/02; G01R 31/2829; G01D 3/10; H04R 29/004; H04R 2420/05; H04R 2499/13
See application file for complete search history.

(56) References Cited

U.S. PATENT DOCUMENTS 4,753,105 A * 6/1988 Juanarena ........... G01L 19/0015
73/1.62
5,477,143 A * 12/1995 Wu ......................... G01V 3/08
324/207.21
(Continued)

OTHER PUBLICATIONS

PCT International Search Report and Written Opinion for PCT/US2013/025347 mailed on Jun. 17, 2013, 13 pages.
(Continued)

*Primary Examiner* — Daniel Miller
(74) *Attorney, Agent, or Firm* — Schwegman Lundberg & Woessner, P.A.

(57) ABSTRACT

Fault detection techniques for control of sensor systems. A sensor control integrated circuit ("IC") may include a fault detection system for coupling to the sensor supply lines. The system may detect faults for each of the sensor supply lines. The fault detection system may level shift sensor supply line signals from a first voltage domain to a second voltage domain appropriate for the fault detection system of the controller IC. The fault detection system may level shift source potential voltages from the first voltage domain to the second voltage domain to detect predetermined fault types. The fault detection system may compare the second domain voltages from the sensor supply lines to voltages representing predetermined fault types and may generate fault status indicators based on the comparison.

30 Claims, 6 Drawing Sheets

(51) Int. Cl.
*G01D 3/10* (2006.01)
*G01R 31/28* (2006.01)

(52) U.S. Cl.
CPC ...... *G01R 31/2829* (2013.01); *H04R 2420/05* (2013.01); *H04R 2499/13* (2013.01)

(56) References Cited

U.S. PATENT DOCUMENTS

| | | |
|---|---|---|
| 7,420,791 B1 | 9/2008 | Dong et al. |
| 2004/0012385 A1* | 1/2004 | Kirkpatrick, II ....... G01D 5/145 324/207.21 |
| 2005/0251364 A1 | 11/2005 | Kang et al. |
| 2006/0284516 A1* | 12/2006 | Shimaoka .............. H04R 19/04 310/322 |
| 2007/0115005 A1* | 5/2007 | Shimizu .................. G01L 25/00 324/549 |
| 2008/0157959 A1 | 7/2008 | Kuris et al. |
| 2008/0162770 A1 | 7/2008 | Titiano et al. |
| 2011/0034964 A1 | 2/2011 | Bi et al. |
| 2011/0133939 A1* | 6/2011 | Ranganathan ....... A61B 5/0008 340/584 |
| 2012/0014022 A1 | 1/2012 | Lin et al. |
| 2012/0045068 A1 | 2/2012 | Kim et al. |
| 2012/0155144 A1 | 6/2012 | Xia et al. |

OTHER PUBLICATIONS

"International Application Serial No. PCT/US2010/056234, Invitation to Pay Additional Fees dated Apr. 11, 2013", 2 pgs.

* cited by examiner

200

300

500

SENSOR FAULT DETECTION SYSTEM AND METHOD

RELATED APPLICATION

This application claims the benefit of priority afforded by U.S. provisional patent application Ser. No. 61/597531, filed on Feb. 10, 2012, the content of which is incorporated herein in its entirety.

BACKGROUND

Transducers are used in a variety of applications including consumer electronics devices, video games, mobile communications devices, and automotive applications. In automotive applications multiple transducers, or microphones, may be coupled to an audio control system. Audio control systems are typically manufactured in an integrated circuit ("IC") and include audio codecs, processors, and controllers which control operation of the microphones for various entertainment and/or communications applications. The audio control IC also monitors the supply lines of the multiple microphones for various faults which may occur during their operation. These faults may include shorts to various supply potential voltages, shorts to ground, supply line shorts to each other, and/or open supply line connections.

For automotive applications, operational supply potentials may be provided in a first high voltage domain, while the audio control system may operate in a second low voltage domain. For example, the first domain supply potentials may include battery voltages, which often range between 11V-18V, and/or microphone supply voltages, which often range between 1V-7V. The second low voltage domain for the audio control IC typically ranges between 3V-5V.

To detect faults on the microphone supply lines, the audio control IC is often coupled to external fault detection devices which operate in the first voltage domain. This is to ensure that shorts that may occur for voltages in the first voltage domain do not damage the audio control IC, which operates in the second voltage domain. Such external devices operating in the first voltage domain add to the complexity, cost, and power consumption of implementing fault detection for a multi-sensor system. Further, such external devices often operate in a non-linear manner and require further signal conditioning in order to properly detect faults or shorts that may occur with the sensor supply lines.

Accordingly, there is a need in the art for a fault detection system which detects faults for a variety of supply potentials within the voltage domain of the fault detection system.

DETAILED DESCRIPTION

Embodiments of the present invention provide fault detection techniques for control of sensor systems. A sensor control integrated circuit ("IC") may include a fault detection system for coupling to the sensor supply lines. The system may detect faults for each of the sensor supply lines. The fault detection system may level shift sensor supply line signals from a first voltage domain to a second voltage domain appropriate for the fault detection system of the controller IC. The fault detection system may level shift source potential voltages from the first voltage domain to the second voltage domain to detect predetermined fault types. The fault detection system may compare the second domain voltages from the sensor supply lines to voltages representing predetermined fault types and may generate fault status indicators based on the comparison.

Figure 1:
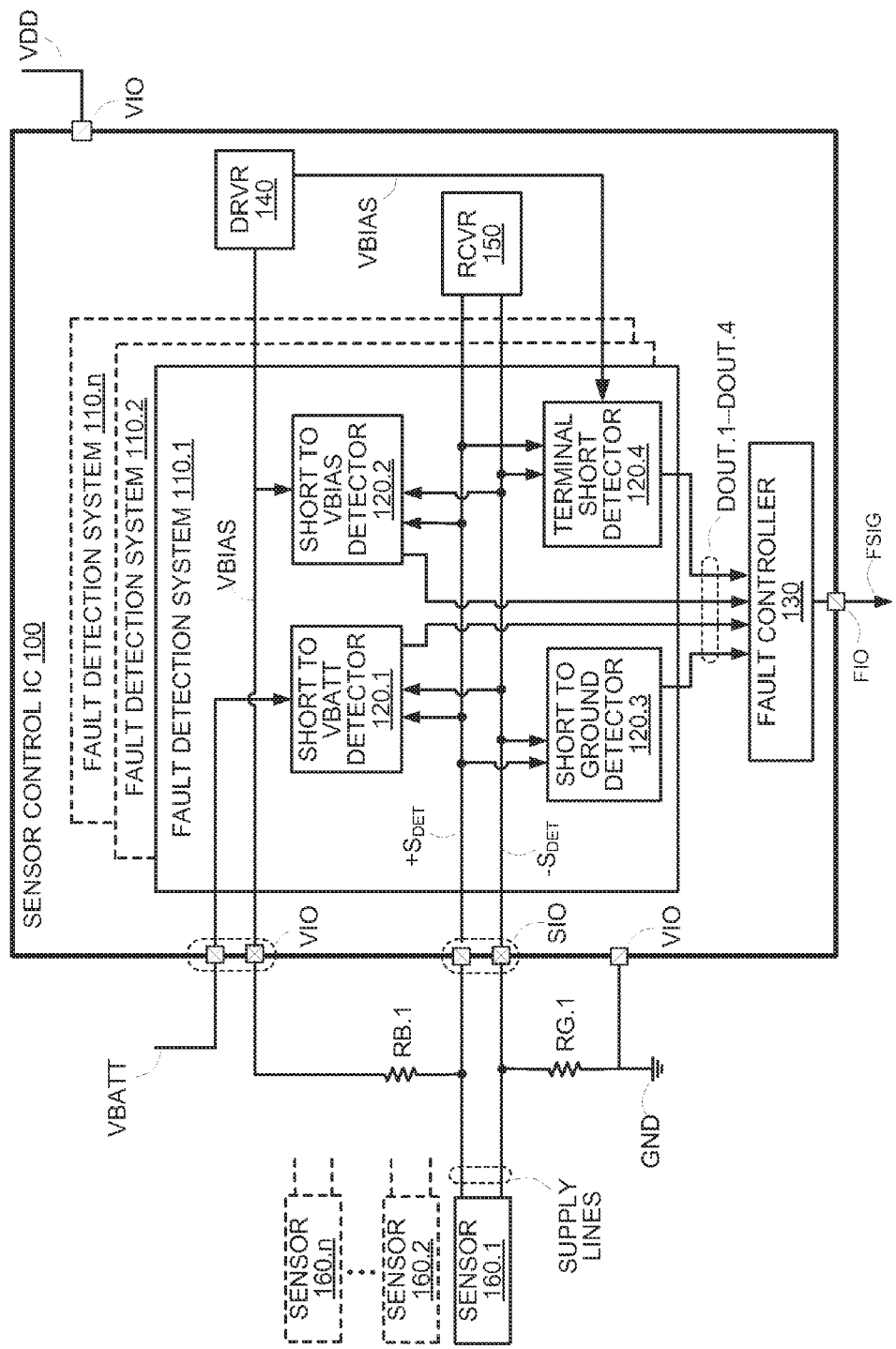
FIG. 1 illustrates a sensor control IC according to an embodiment of the present invention.

FIG. 1 illustrates a sensor control IC 100 according to an embodiment of the present invention. The control IC 100 may be coupled to a sensor 160.1 via a pair of sensor supply lines at a pair of sensor input/output ("I/O") terminals SIO. The control IC 100 may include a fault detection system 110.1, a fault controller 130, a driver 140, and a receiver 150. The fault detection system 110.1 may include fault detector circuits 120.1-120.4, which may be coupled to the sensor I/O terminals SIO via a pair of detection lines $+S_{DET}$, $-S_{DET}$. Each fault detector circuit 120.1-120.4 may output fault status signals DOUT.1-DOUT.4, which may indicate a fault status of the sensor supply lines with respect to a predetermined fault type. The fault controller 130 may receive the fault status signals DOUT.1-DOUT.4, and upon determining that a particular fault type has occurred, may generate a fault status indicator, shown here as FSIG coupled to an I/O terminal FIO, The fault status indicator FSIG may be communicated to an external processor (not shown) that may maintain an operating status for the sensor 160.1.

The control IC 100 may manage the driver 140 and the receiver 150 for operation of the sensor 160.1. The driver 140 may provide a sensor source potential VBIAS for operation of the sensor 160.1 via a voltage I/O terminal VIO. The sensor supply potential VBIAS may be provided to the sensor 160.1 via a bias resistor RB.1 coupled to a first line of the sensor supply line pair. A second line of the sensor supply line pair may be coupled to a common source potential GND via a pull-down resistor RG.1. The receiver 150 may capture and/or decode return signals from the sensor 160.1 via the pair of detection lines $+S_{DET}$, $-S_{DET}$ for further processing.

The control IC 100 may receive various IC source potentials through various voltage I/O terminals VIO. An IC source potential, shown as VDD, may provide operating power for the control IC 100, the fault detection system 110.1, and other components of the control IC 100 including the fault controller 130, the driver 140, and the receiver 150. The control IC 100 may also be coupled to the common source potential GND through a voltage I/O terminal VIO. Although not illustrated, the fault detection system 110.1, the fault controller 130, the driver 140, and the receiver 150 may also be coupled to the common source potential GND.

The control IC 100 may also receive a battery source potential, shown as VBATT, which may represent a battery voltage, say from an automobile battery. Although illustrated in close proximity to the control IC 100, the sensor 160.1 may be located by an extended length away from the control IC 100. For example, in an automobile application, the sensor 160.1 may be located several feet from the control IC 100. Thus, the sensor supply lines may be extended throughout the automobile cabin and may become shorted not only to the sensor supply potential VBIAS, but also may become shorted to the battery potential VBATT from the automobile battery. It should therefore be understood that the control IC 100 may detect faults not only with respect to the sensor source potentials, but also source potentials that may be external to control IC 100 source potentials.

As discussed, the fault detector circuits 120.1-120.4 may be configured to detect predetermined fault types that may occur for the pair of sensor supply lines, which may be coupled to the detection lines $+S_{DET}$, $-S_{DET}$ via the sensor I/O terminals SIO. Each fault detector circuit 120.1-120.4 may include an active and/or passive level shifting system (not shown) and a comparator system (not shown), which may be configured to detect each of the predetermined fault types. The comparators may operate from the IC source potential VDD. The detector circuits 120.1-120.4 may receive various source potentials from the first domain and level shift or down-convert the signals to a second domain within the operating range of the IC source potential VDD. The down-converting to the second domain may ensure that the comparators within the fault detector circuits 120.1-120.4 may not be damaged during detection of the predetermined fault types. The level shifting systems and comparator systems will be discussed in further detail below for FIGS. 2-4.

The detector circuit 120.1 may receive the battery source potential VBATT, and may detect a short between VBATT and either of the sensor supply lines (e.g., $+S_{DET}$, $-S_{DET}$). The detector 120.2 may receive the sensor source potential VBIAS, and may detect a short between VBIAS and either of the sensor supply lines (e.g., $+S_{DET}$, $-S_{DET}$). The detector 120.3 may detect a short between the common source potential GND and either of the sensor supply lines (e.g., $+S_{DET}$, $-S_{DET}$). The detector 120.4 may receive the sensor source potential VBIAS, and may detect a short between the pair of sensor supply lines themselves. The fault controller 130 may determine an open connection for a pair of sensor supply lines if detector 120.2 indicates a short between the detection line $+S_{DET}$ and VBIAS and detector 120.3 indicates a short between the detection line $-S_{DET}$ and GND.

During operation of the control IC 100, the sensor source potential VBIAS and the battery source potential VBATT may be within the first voltage domain and the IC source potential VDD may be within the second voltage domain. Each detector circuit 120.1-120.4 may down-convert voltage signals received from the detection lines $+S_{DET}$, $-S_{DET}$ (as either may be shorted to VBIAS or VBATT) and/or the source potentials VBIAS or VBATT to the second voltage domain. Each fault detector circuit 120.1-120.4 may compare the second domain detection line voltages to corresponding second domain source potential voltages to determine if a fault has occurred for a corresponding detection line (i.e., sensor supply line). For example, the detector circuit 120.1 may determine a fault between either detection line $+S_{DET}$ or $-S_{DET}$ and the battery source potential VBATT. The detector circuit 120.1 may down-convert the first domain signals from $+S_{DET}$, $-S_{DET}$, and VBATT to the second domain and compare each second domain detection line signal to the second domain source potential signal corresponding to VBATT. If either second domain detection line signal may be at a level near the second domain source potential signal, the detector circuit 120.1 may indicate a fault for the corresponding detection line.

If a predetermined fault type may be detected for either detection line $+S_{DET}$ or $-S_{DET}$, a corresponding detector 120.1-120.4 may indicate the fault to the fault controller 130. As discussed, the fault controller may also determine an open connection for a pair of sensor supply lines. The fault controller 130 may communicate the fault status of each predetermined fault type to an external processor (not shown) through the fault status signal FSIG.

The control IC 100 may provide for the flexibility of providing fault detection for a plurality of sensors and sensor types. In an embodiment, a plurality of sensors 160.1-160.*n* may be coupled to a plurality of corresponding fault detector systems 110.1-110.*n*. Each corresponding fault detector system 110.1-110.*n* may be configured to detect predetermined fault types for each pair of sensor supply lines for the corresponding sensors 160.1-160.*n*. In an embodiment, each of the fault status output signals DOUT.1-DOUT.4 from fault detectors 120.1-120.4 of corresponding fault detector systems 110.1-110.*n* may include a pair of status signals corresponding to the fault status for each of the detection lines $+S_{DET}$, $-S_{DET}$. In another embodiment, each of the fault status signals DOUT.1-DOUT.4 may include a single status signal corresponding to a fault status for the pair of detection lines +SDET, −SDET (e.g., the sensor supply lines may be shorted together).

In an embodiment, the sensor 160.1 may be a microphone for use in an automotive audio system. In another embodiment, the sensor 160.1 may be a pressure sensors for use in an automotive collision detection system. In another embodiment, the sensor 160.1 may be a proximity sensor for use in an automotive collision avoidance system. In yet another embodiment, the sensor 160.1 may be a temperature sensor for use in an automotive climate control system. The control IC 100 may not be limited to automotive applications, however, and such fault detection and level shifting techniques may be extended to marine and aerospace applications. Further, the control IC 100 may be implemented for consumer electronics devices such as mobile communications devices, mobile computing devices, home theater devices, and video game devices. Although the sensor 160.1 is shown as having a pair of supply lines, embodiments of the present invention may also provide techniques to detect faults for a sensor operating from a single-ended supply line (e.g., using single ended signaling from a single ended sensor). Thus, the return signal from the sensor 160.1 does not have to be a differential signal.

Figure 2:
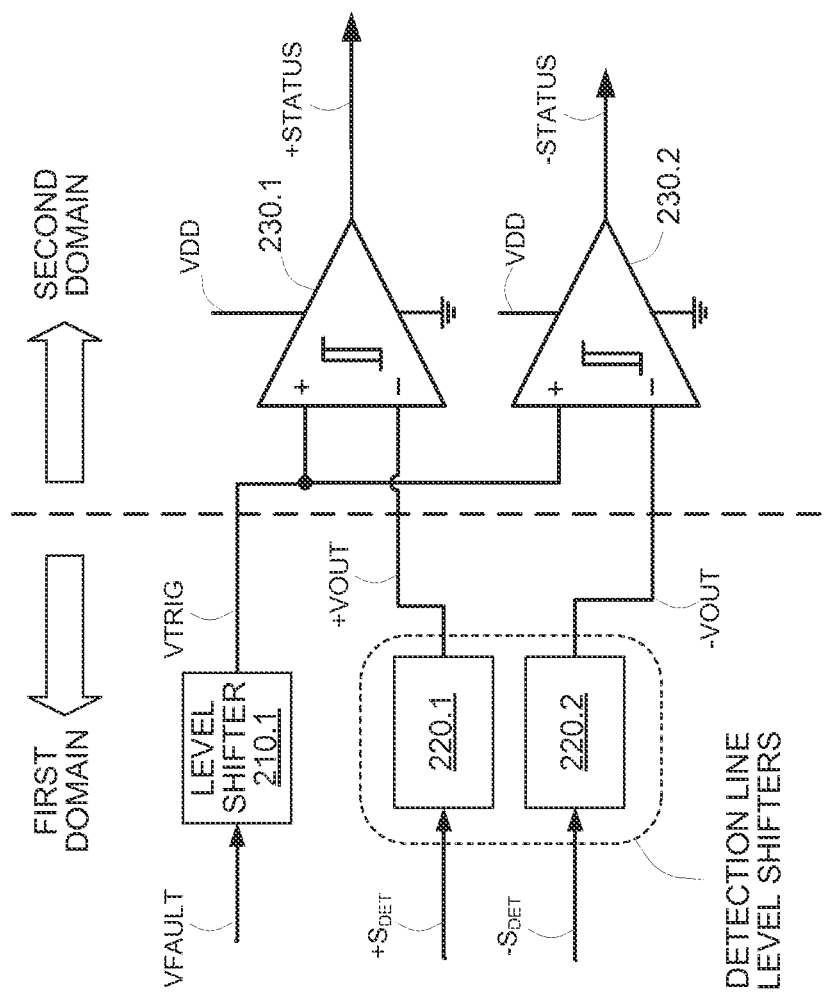
FIG. 2 illustrates a fault detector circuit for a pair of sensor supply lines according to an embodiment of the present invention.

FIG. 2 illustrates a fault detector circuit 200 for a pair of detection lines according to an embodiment of the present invention. The circuit 200 may include a trigger level shifter 210, a pair of detection line level shifters 220.1, 220.2, and a pair of comparators 230.1, 230.2. Each detection line level shifter 220.1, 220.2 may receive a respective detection line signal $+S_{DET}$, $-S_{DET}$ that may represent input signals from a first voltage domain and may generate a corresponding output signal +VOUT, −VOUT within a second voltage domain. The trigger level shifter 210 may receive an input signal VFAULT and generate a trigger signal VTRIG within the second voltage domain. Each comparator 230.1, 230.2 may receive supply rails VDD and GND, which may be in the second voltage domain.

The pair of comparators 230.1, 230.2 may be operational amplifiers ("op-amps"). The first comparator 230.1 may have a non-inverting input coupled to the trigger signal VTRIG and an inverting input coupled to the first detection line level shifter 220.1 output signal +VOUT. The second comparator 230.2 may have a non-inverting input coupled to the trigger signal VTRIG and an inverting input coupled to the second detection line level shifter 220.2 output signal −VOUT. Each comparator 230.1, 230.2 may compare the trigger signal VTRIG to a corresponding level shifted output signal +VOUT, −VOUT to determine a fault status for a corresponding detection line +$S_{DET}$, −$S_{DET}$. Based on the respective comparisons, each comparator may 230.1, 230.2 may generate a corresponding fault status output signal +STATUS, −STATUS indicating if a fault has occurred for a predetermined fault type.

Figure 5:
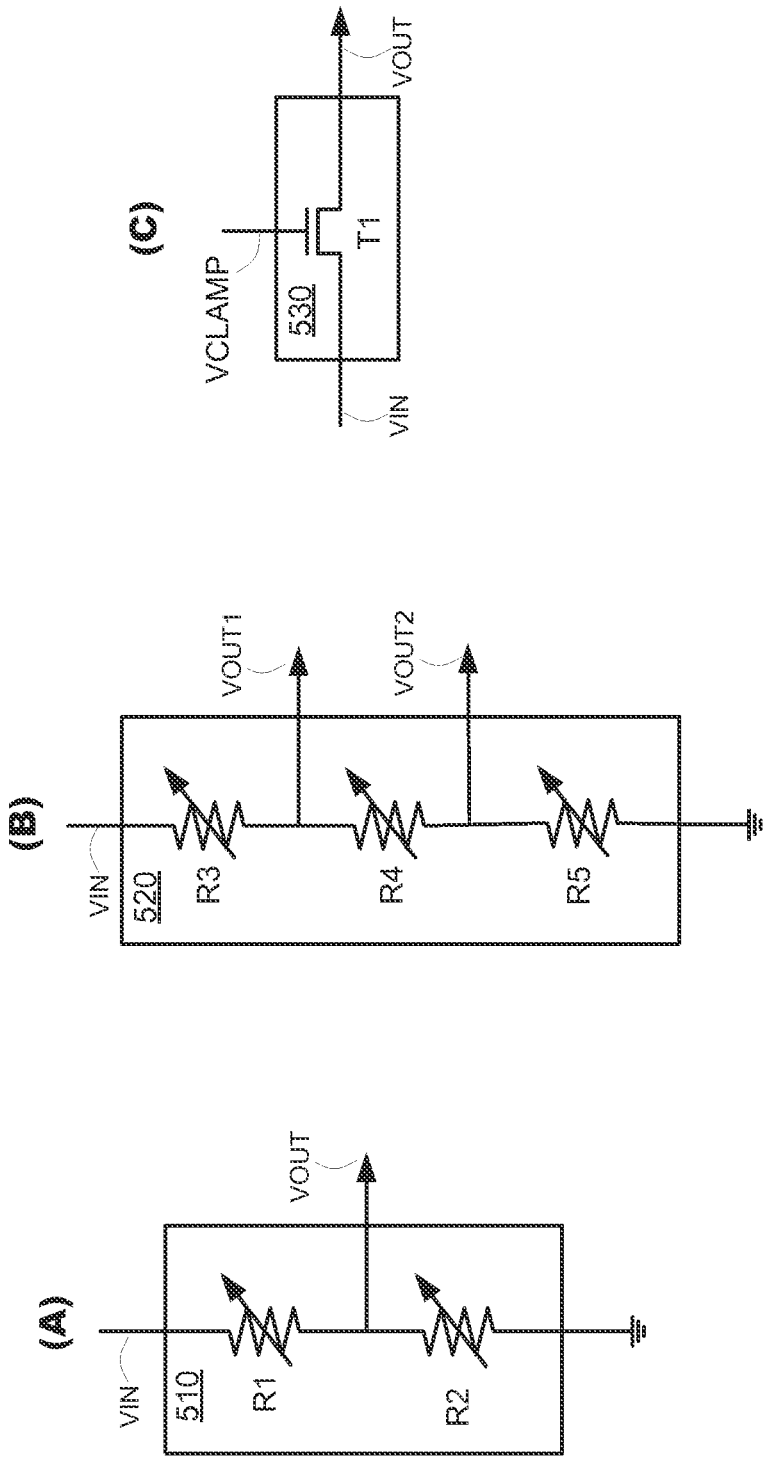
FIGS. 5A, 5B, and 5C illustrate a level shifter circuit according to an embodiment of the present invention.

The trigger level shifter 210 may be a voltage divider circuit including a resistor network (not shown). In an embodiment, each detection line level shifter 220.1, 220.2 may be a voltage divider circuit including a resistor network (not shown). In another embodiment, each detection line level shifter 220.1, 220.2 may be a transistor voltage clamping circuit (not shown). Configuration of each detection line level shifter 220.1, 220.2 as either a voltage divider network or a transistor voltage clamping circuit may depend on the predetermined fault type to be detected by the fault detector circuit. The level shifting circuit types are described in more detail in FIG. 5, below.

The fault detector circuit 200 may be configured for detecting faults between each of the detection lines +$S_{DET}$, −$S_{DET}$ and various source potentials. In one example, the fault detector circuit 200 may be configured to detect faults between each of the detection lines +$S_{DET}$, −$S_{DET}$ and the battery source potential VBATT of FIG. 1. In this example, the voltage signal VFAULT being input to the trigger level shifter 210 may be set to VBATT from within the first voltage domain. In another example, the fault detector circuit 200 may be configured to detect faults between each of the detection lines +$S_{DET}$, −$S_{DET}$ and the sensor source potential VBIAS of FIG. 1. In this example, the voltage signal VFAULT being input to the trigger level shifter 210 may be set to VBIAS from within the first voltage domain.

For detecting a short between either detection line +$S_{DET}$ or −$S_{DET}$ and the battery source potential VBATT, the trigger level shifter 210 may be configured to generate a trigger voltage VTRIG that may be a representation of the battery source potential VBATT down-converted to a level within the second voltage domain. The detection line level shifters 220.1, 220.2 may down-convert each detection line signal +$S_{DET}$, −$S_{DET}$ to corresponding output voltages +VOUT, −VOUT also within the second voltage domain. The detection line level shifters 220.1, 220.2 may be configured as resistor network voltage dividers in this example. Each corresponding comparator 230.1, 230.2 may generate a corresponding fault status indicator +STATUS, −STATUS indicating a fault if corresponding voltages +VOUT or −VOUT may be greater than VTRIG. Each corresponding comparator 230.1, 230.2 may generate a corresponding fault status indicator +STATUS, −STATUS indicating no fault if corresponding voltages +VOUT or −VOUT may be less than VTRIG.

For detecting a short between either detection line +$S_{DET}$ or −$S_{DET}$ and the sensor source potential VBIAS, the trigger level shifter 210 may be configured to generate a trigger voltage VTRIG that may be a representation of the sensor source potential VBIAS down-converted to a level within the second voltage domain. The detection line level shifters 220.1, 220.2 may down-convert each detection line signal +$S_{DET}$, −$S_{DET}$ to corresponding output voltages +VOUT, −VOUT also within the second voltage domain. The detection line level shifters 220.1, 220.2 may be configured as resistor network voltage dividers in this example. Each corresponding comparator 230.1, 230.2 may generate a corresponding fault status indicator +STATUS, −STATUS indicating a fault if corresponding voltages +VOUT or −VOUT may be greater than VTRIG. Each corresponding comparator 230.1, 230.2 may generate a corresponding fault status indicator +STATUS, −STATUS indicating no fault if corresponding voltages +VOUT or −VOUT may be less than VTRIG.

In another example, the fault detector circuit 200 may be configured to detect faults between each of the detection lines +$S_{DET}$, −$S_{DET}$ and the common source potential GND of FIG. 1. In this example, the voltage signal VFAULT being input to the trigger level shifter 210 may be set to the IC source potential VDD of FIG. 1. The voltage signal VFAULT being input to the fault voltage level shifter 201 may also set by a bandgap reference voltage. A bandgap reference voltage is a voltage whose level may remain at an approximately constant level independent of supply voltage, process, or operating temperature variations.

For detecting a short between either detection line +$S_{DET}$ or −$S_{DET}$ and the common source potential GND, the trigger level shifter 210 may be configured to generate a trigger voltage VTRIG that may be set at or near 0V or ground. The detection line level shifters 220.1, 220.2 may be configured as transistor voltage clamping circuits rather than resistor network voltage dividers. The transistor voltage clamping circuits may improve linearity for detection line voltages +$S_{DET}$ or −$S_{DET}$ that may be shorted to ground (i.e., at a voltage level near ground or 0V). In contrast, resistor network voltage dividers which may degrade linearity for low voltage signals. The transistor voltage clamping circuits may also clamp or limit detection line voltages +$S_{DET}$ or −$S_{DET}$ that may rise above the second domain operating tolerances for the comparators 230.1, 230.2 when either may be shorted to VBIAS or VBATT. Thus, the transistor voltage clamping circuits for the detection line level shifters 220.1, 220.2 may generate corresponding output voltage +VOUT, −VOUT that may remain within the second voltage domain.

Each corresponding comparator 230.1, 230.2 may generate a corresponding fault status indicator +STATUS, −STATUS indicating a fault to the common source potential GND if corresponding voltages +VOUT or −VOUT may be less than VTRIG. Each corresponding comparator 230.1, 230.2 may generate a corresponding fault status indicator +STATUS, −STATUS indicating no fault if corresponding voltages +VOUT or −VOUT may be greater than VTRIG.

Figure 3:
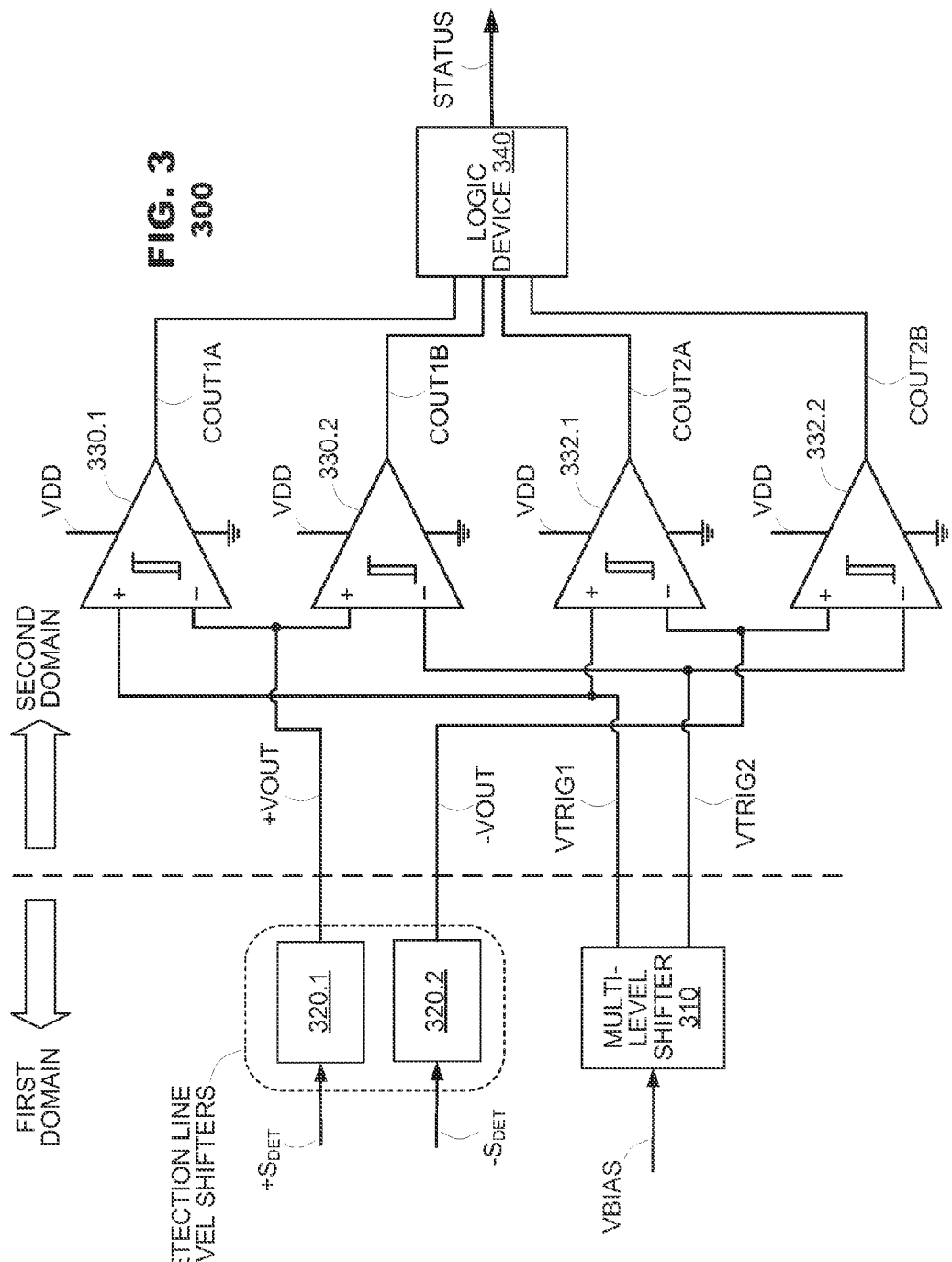
FIG. 3 illustrates another fault detector circuit for a pair of sensor supply lines according to an embodiment of the present invention.

FIG. 3 illustrates another fault detector circuit 300 for a pair of detection lines according to an embodiment of the present invention. The circuit 300 may include a trigger level shifter 310, a pair of detection line level shifters 320.1, 320.2, two pairs of comparators 330.1, 330.2, 332.1, 332.2, and a logic device 340. Each detection line level shifter 320.1, 320.2 may receive a respective detection line signal +$S_{DET}$, −$S_{DET}$ that may represent input signals from a first voltage domain and may generate a corresponding output signal +VOUT, −VOUT within a second voltage domain. The trigger level shifter 310 may receive the sensor source potential VBIAS of FIG. 1 within the first voltage domain and may generate a pair of trigger signals VTRIG1, VTRIG2 within the second voltage domain. Each comparator 330.1, 330.2, 332.1, 332.2 may receive supply rails VDD and GND, which may be in the second voltage domain.

The comparators 330.1, 330.2, 332.1, 332.2 may be configured as op-amps. The first comparator 330.1 of the first pair may have a non-inverting input coupled to the first trigger signal VTRIG1 and an inverting input coupled to the first detection line level shifter 320.1 output signal +VOUT.

The comparator 330.1 may generate an output signal COUT1A. The second comparator 330.2 of the first pair may have a non-inverting input coupled to the first detection line level shifter 320.1 output signal +VOUT and an inverting input coupled to the second trigger signal VTRIG2. The comparator 330.2 may generate an output signal COUT1B. The first comparator 332.1 of the second pair may have a non-inverting input coupled to the first trigger signal VTRIG1 and an inverting input coupled to the second detection line level shifter 320.2 output signal −VOUT. The comparator 332.1 may generate an output signal COUT2A. The second comparator 332.2 of the second pair may have a non-inverting input coupled to the second detection line level shifter 320.2 output signal −VOUT and an inverting input coupled to the second trigger signal VTRIG2. The comparator 332.2 may generate an output signal COUT2B. Each of the comparator output signals COUT1A, COUT2A, COUT1B, and COUT2B may be coupled to the logic device 340 which may generate an output signal STATUS indicating a fault status for the fault detector circuit 300.

The fault detector circuit 300 may detect a fault if the detection lines $+S_{DET}$, $-S_{DET}$ (e.g., the corresponding sensor supply lines) may be shorted together. The trigger signals VTRIG1, VTRIG2 may represent a "window" around the sensor source potential VBIAS. For example, when the detection lines $+S_{DET}$, $-S_{DET}$ may be shorted together, the sensor source potential VBIAS may be effectively divided across each detection line $+S_{DET}$, $-S_{DET}$. The trigger signals VTRIG1, VTRIG2 may be set to corresponding levels representing upper and lower bounds or a window around VBIAS/2.

During operation, each of the first pair of comparators 330.1, 330.2 may compare the trigger signals VTRIG1, VTRIG2 to the corresponding detection line level shifter 320.1 output +VOUT. Each of the second pair of comparators 332.1, 332.2 may compare the trigger signals VTRIG1, VTRIG2 to the corresponding detection line level shifter 320.2 output −VOUT. If the detection line level shifter 320.1 output +VOUT may be at a level within the trigger window signals VTRIG1, VTRIG1, the corresponding comparators 330.1, 330.2 may generate output signals COUT1A, COUT1B indicating a fault. If the detection line level shifter 320.2 may be at a level within the trigger window signals VTRIG1, VTRIG2, the corresponding comparators 332.1, 332.2 may generate output signals COUT2A, COUT2B indicating a fault.

If each comparator output signal COUT1A, COUT2A, COUT1B, and COUT2B may indicate a fault, the logic device 340 may set the output signal STATUS to indicate a fault for the detection lines $+S_{DET}$, $-S_{DET}$ being shorted together. However, if any of the output signals COUT1A, COUT2A, COUT1B, and COUT2B may not indicate a fault, the logic device 340 may set the output signal STAT to indicate no fault for the detection lines $+S_{DET}$, $-S_{DET}$ being shorted together.

In one embodiment, the comparator output signals COUT1A, COUT2A, COUT1B, and COUT2B may all be logic high signals to indicate such a fault. In such an embodiment, the logic device 340 may be configured as an 'AND' logic device. In another embodiment, the comparator output signals COUT1A, COUT2A, COUT1B, and COUT2B may all be logic low signals to indicate such a fault. In such an embodiment, the logic device 340 may be configured as a 'NOR' logic device.

Figure 4:
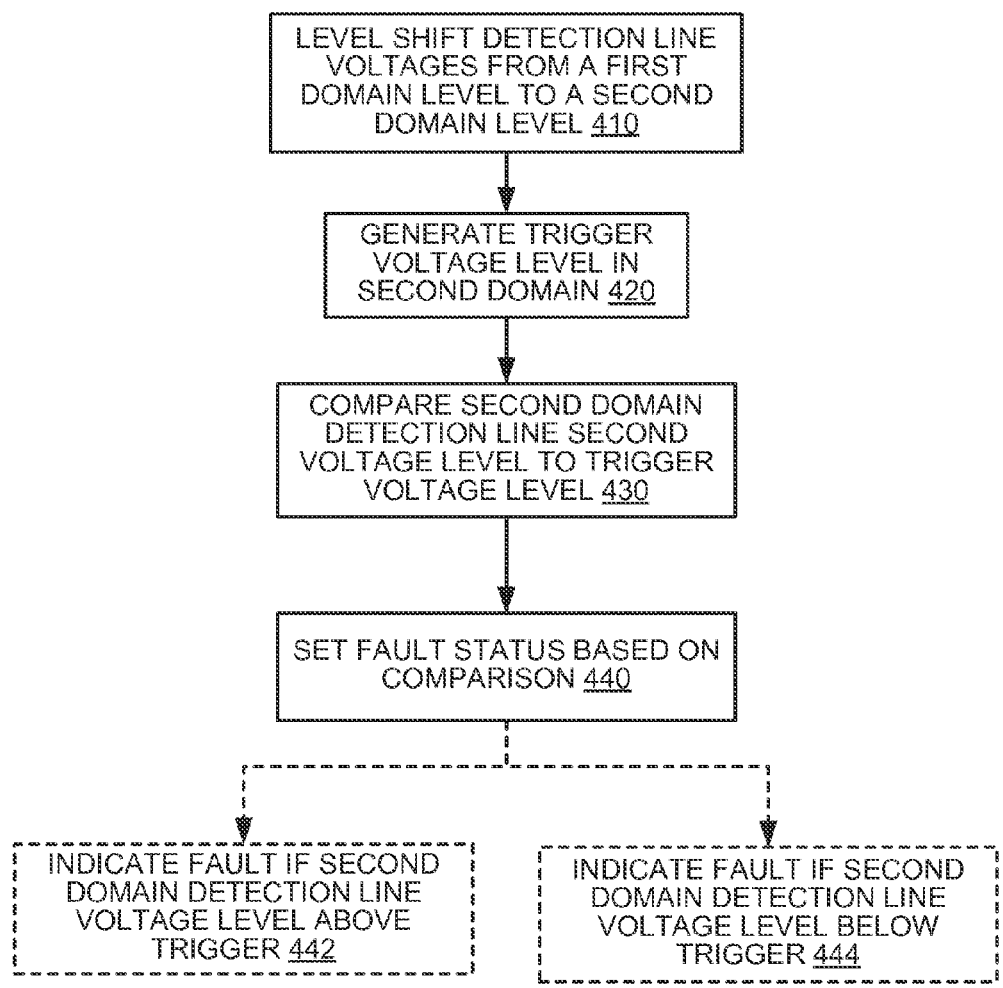
FIG. 4 illustrates a method for determining a fault status for a pair of sensor supply lines according to an embodiment of the present invention.

FIG. 4 illustrates a method 400 for determining a fault status for each of a pair of sensor supply lines according to an embodiment of the present invention. As illustrated in FIG. 4, the method may level shift each supply line voltage from a first domain voltage level to a second domain voltage level (block 410). The method 400 may generate a trigger voltage level within the second voltage domain from an input voltage (block 420). The method 400 may compare each of the second domain supply line voltage levels to the second domain trigger voltage level (block 430). The method 400 may set a fault status for each supply line based on the comparison (block 440).

In an embodiment, the method 400 may set the fault status to indicate a fault if a second domain supply line voltage level is above the second domain trigger voltage level (block 442). For example, to indicate a supply line fault to the supply line voltage VBIAS or the battery voltage VBATT as described in FIG. 2. In another embodiment, the method 400 may set the fault status to indicate a fault if a second domain supply line voltage level is below the trigger voltage level (block 444). For example, to indicate a supply line fault to the common source potential GND as described in FIG. 2. In yet another embodiment, the method 400 may generate two trigger voltage levels and set the fault status to indicate a fault if each supply line second voltage level is between the two trigger voltage levels. For example, to indicate a fault of a pair of supply lines being shorted together as described in FIG. 3.

FIGS. 5A, 5B, and 5C illustrate level shifter circuits 500 for according to an embodiment of the present invention. As discussed, each detector circuit 120.1-120.4 of FIG. 1 may include level shifters to down-convert input voltage signals from a first voltage domain to a second voltage domain within the operating voltage constraints of the fault detection system 110. FIGS. 5A and 5B illustrate level shifters according to an embodiment of the present invention and include various resistor networks to down-convert an input voltage signal VIN. FIG. 5C illustrates a level shifter according to an embodiment of the present invention and includes a transistor to down-convert an input voltage signal VIN. Any combination of the level shifters as illustrated in FIGS. 5A-5C may be included in the detector circuits 120.1-120.4 of FIG. 1.

As illustrated in FIG. 5A, a level shifter 510 may include a voltage divider network having a first programmable resistor R1 receiving an input voltage VIN. The first programmable resistor R1 may be coupled in series with a second programmable resistor R2. The level shifter of FIG. 5A may generate an output voltage VOUT at the connection between the first and second programmable resistors R1 and R2. The output voltage VOUT may be within the second voltage domain. The relationship of the input voltage VIN to the output voltage VOUT may be as follows: VOUT=(R2/(R1+R2))*VIN. Each of the first and second programmable resistors R1 and R2 may be configured to adjust the output voltage VOUT based on the input voltage VIN. In an embodiment, the fault controller 130 of FIG. 1 may set the resistances for R1 and R2 for a given detector circuit 120.1-120.4. For example, say the battery source potential VBATT connected to the detector circuit 120.1 of FIG. 1 may vary through operation of the fault detector circuit between 11V and 18V. The fault controller 130 may adjust the resistances for R1 and R2 (VIN being set to VBATT) to account for these variations in order to ensure proper detection of a short to VBATT.

As illustrated in FIG. 5B, a level shifter 520 may include a voltage divider network having a first programmable resistor R3 receiving an input voltage VIN. The first programmable resistor R3 may be coupled in series to a second programmable resistor R4, which may be coupled in series to a third programmable resistor R5. The level shifter 520 may generate a first output voltage VOUT1 at the connection between the first and second programmable resistors R3 and R4. The relationship of the input voltage VIN to the first output voltage VOUT may be as follows: VOUT1=((R4+R5)/(R3+R4+R5))*VIN. The level shifter 520 may generate a second output voltage VOUT2 at the connection between the second and third resistors R4 and R5. The relationship of the second output voltage VOUT2 to the input voltage VIN may be as follows: VOUT2=(R5/(R3+R4+R5))*VIN. The output voltages VOUT1, VOUT2 may be within the second voltage domain. In an embodiment, the fault controller 130 of FIG. 1 may set the resistances for R3, R4, and/or R5 for a given detector circuit 120.1-120.4.

As illustrated in FIG. 5C, a level shifter 530 may include a transistor T1. The transistor T1 may be an NMOS transistor, but is not so limited. The level shifter 530 may receive an input voltage VIN at a drain of transistor T1 and generate an output voltage VOUT at a source of transistor T1. The transistor T1 may receive a clamping voltage VCLAMP at a gate of the transistor T1. The clamping voltage VCLAMP, may limit the output voltage VOUT of the transistor T1 to within the second voltage domain. Whether the clamping voltage VCLAMP limits the output voltage VOUT may depend on the value of the input voltage VIN. For example, if the input voltage VIN is lower than the clamping voltage VCLAMP, then the output voltage VOUT may be equal to approximately the input voltage VIN. If the input voltage is higher than the clamping voltage VCLAMP, then the output voltage VOUT may be equal to approximately the difference between the clamping voltage VCLAMP and the threshold voltage VTH of the transistor T1. The clamping voltage may be set to a predetermined value or a low power supply voltage (e.g., 5 or 3.3 volts, but is not so limited). For example, if the clamping voltage VCLAMP is set to 5 volts and the input voltage Vin varies between 0V-11V, the transistor output voltage VOUT may linearly track variations in the input voltage VIN for input voltages between 0V and 5V-VTH. For input voltages VIN greater than 5V-VTH, the output voltage VOUT may be clamped to 5V-VTH.

Figure 6:
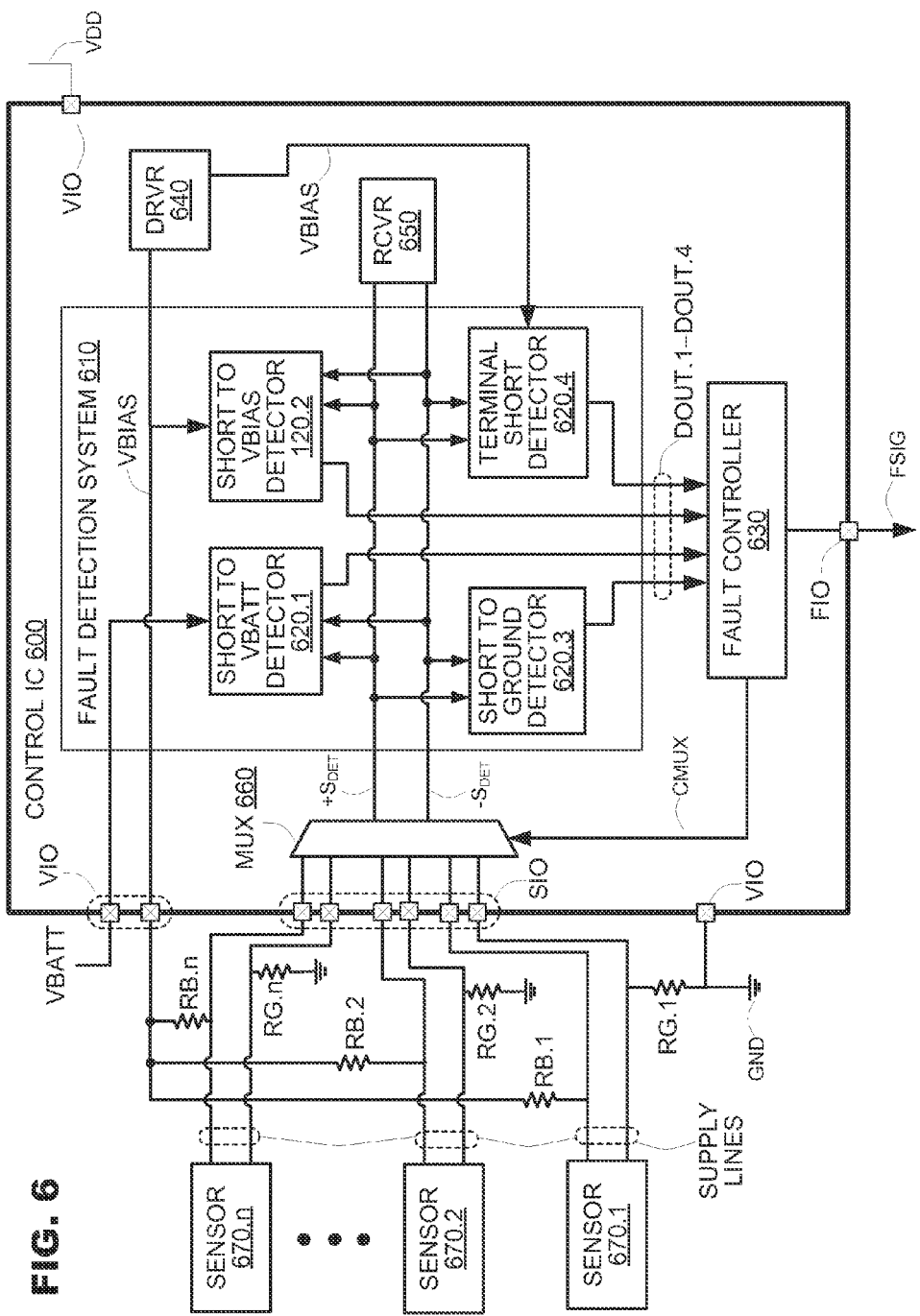
FIG. 6 illustrates a sensor control IC according to an embodiment of the present invention.

FIG. 6 illustrates a multi-sensor control IC 600 according to an embodiment of the present invention. The control IC 600 may be coupled to sensors 670.1-670.n at corresponding pairs of sensor I/O terminals SIO. The control IC 600 may include a fault detection system 610, a fault controller 630, a sensor driver 640, a sensor receiver 650, and routing fabric, shown here as multiplexer ("MUX") 660. The fault detection system 610 may include fault detector circuits 620.1-620.4. The fault detector circuits 620.1-620.4 may have inputs coupled to the MUX 630 via a pair of detection lines $+S_{DET}$, $-S_{DET}$. The fault controller 630 may control the MUX 630 via a control signal CMUX to couple the inputs of the fault detector circuits 620.1-620.4 to select sensor I/O terminals SIO for corresponding sensors 670.1-670.1.

Each fault detector circuit 620.1-620.4 may output fault status signals DOUT.1-DOUT.4, which may indicate a fault status of the sensor supply lines with respect to a predetermined fault type. The fault controller 630 may receive the fault status signals DOUT.1-DOUT.4, and upon determining that a particular fault type has occurred, may generate a fault status indicator, shown here as FSIG coupled to I/O terminal FIO, The fault status signal FSIG may be communicated to an external processor (not shown) that may maintain an operating status for each sensor 670.1-670.n.

The control IC 600 may manage the driver 640 and the receiver 650 for operation of the sensors 670.1-670.n. The driver 640 may provide a sensor source potential VBIAS for operation of the sensors 670.1-670.n via a voltage I/O terminal VIO. The sensor supply potential VBIAS may be provided to each sensor 670.1-670.n via corresponding bias resistors RB.1-RB.n coupled to a first line of the sensor supply line pair. A second line of each corresponding sensor supply line pair may be coupled to a common source potential GND via pull-down resistors RG.1-RG.n. The receiver 650 may capture and/or decode return signals from corresponding sensor 670.1-670.n via the pair of detection lines $+S_{DET}$, $-S_{DET}$.

During operation, the fault controller 630 may manage the MUX 660 to couple the detection lines $+S_{DET}$, $-S_{DET}$ to the supply lines for each of the sensors 670.1-670.n. The fault detector circuits 620.1-620.4 may operate in a manner similar to that described above for the fault detector circuits 120.1-120.4 of FIG. 1. As the MUX 660 may cycle through the sensors 670.1-670.n, the fault detector circuits 620.1-620.4 may monitor the corresponding sensor supply lines for predetermined faults types. As discussed, the fault types may include shorts to the sensor source potential VBIAS, the battery source potential VBATT, the common source potential GND, supply lines being shorted together, or supply lines being disconnected (open) from a sensor. The fault detector circuits may down-convert various source potentials and input signals from the detection lines $+S_{DET}$, $-S_{DET}$ from a first voltage domain to a second voltage domain to check for the predetermined fault types.

Several embodiments of the present invention are specifically illustrated and described herein. However, it will be appreciated that modifications and variations of the present invention are covered by the above teachings. In other instances, well-known operations, components and circuits have not been described in detail so as not to obscure the embodiments. It can be appreciated that the specific structural and functional details disclosed herein may be representative and do not necessarily limit the scope of the embodiments.

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

We claim:

1. A controller integrated circuit (IC) for determining fault status of a sensor operating in a high voltage, sensor voltage domain that exceeds an IC voltage domain of the IC, the controller IC comprising:
  a fault detection circuit to convert one or more sensor return signals from the sensor voltage domain to the IC voltage domain and detect one or more predetermined fault types based on a comparison of a respective sensor return signal with an IC voltage domain reference voltage representative of the predetermined fault occurring at the sensor in the sensor voltage domain the fault detection circuit including:
    a first level shifter to receive a reference input signal from the sensor voltage domain and to generate a trigger signal in the IC voltage domain;
    a second level shifter to receive the one or more sensor return signals from the sensor voltage domain and to generate one or more corresponding level shifted sensor signals within the IC voltage domain; and a comparator to compare the one or more level shifted sensor signals to the trigger signal to determine whether to generate a first fault status signal representing a detected sensor fault of the predetermined fault type.

2. The circuit of claim 1, wherein the first level shifter and the second level shifter include high voltage devices operating in the high voltage, sensor voltage domain compared to the IC voltage domain.

3. The circuit of claim 1, wherein the first level shifter includes a programmable voltage divider network to generate the one or more trigger signals.

4. The circuit of claim 1, wherein the second level shifter includes a programmable voltage divider network to generate the level shifted one or more sensor signals.

5. The circuit of claim 1, comprising a fault controller to determine whether a sensor input terminal is disconnected from the sensor.

6. The circuit of claim 1, wherein the IC further comprises:
multiple sensor input terminals, each for coupling to a respective sensor; and
a multiplexer coupling the fault detection circuit to at least a selected one of the sensor input terminals in response to a control signal.

7. The circuit of claim 1, wherein the IC further comprises a decoder to process the one or more sensor return signals.

8. The circuit of claim 7, wherein the receiver is configured to capture the one or more sensor return signals from a sensor operating from a single-ended supply line.

9. The circuit of claim 1, including:
one or more sensor input terminals; and
a receiver configured to receive the one or more sensor return signals at the one or more sensor input terminals.

10. The circuit of claim 1, in combination with the sensor.

11. The circuit of claim 10, wherein the detected sensor fault is an automotive sensor fault.

12. The circuit of claim 10, wherein the detected sensor fault is a microphone fault.

13. The circuit of claim 10, wherein the detected sensor fault is a pressure sensor fault.

14. The circuit of claim 10, wherein the detected sensor fault is a proximity sensor fault.

15. The circuit of claim 10, wherein the detected sensor fault is a temperature sensor fault.

16. The circuit of claim 1, wherein the fault detection circuit includes a fault controller configured to receive a fault status signal from the fault detection circuit and to output a fault status indicator representing the detected fault.

17. The circuit of claim 1, including a driver circuit configured to provide a sensor supply voltage at a sensor supply terminal of the circuit.

18. A controller integrated circuit (IC) for determining fault status of a sensor operating in a high voltage, sensor voltage domain that exceeds an IC voltage domain of the IC, the controller IC comprising:
means for converting one or more sensor return signals from the sensor voltage domain to the IC voltage domain, and for detecting one or more predetermined fault types based on a comparison of a respective sensor return signal with an IC voltage domain reference voltage representative of the predetermined fault occurring at the sensor in the sensor voltage domain, wherein the means for converting and for detecting includes:
means for receiving a reference input signal from the sensor voltage domain and for generating a trigger signal in the IC voltage domain;
means for receiving the one or more sensor return signals from the sensor voltage domain and for generating one or more corresponding level shifted sensor signals within the IC voltage domain; and
means for comparing the one or more level shifted sensor signals to the trigger signal to determine whether to generate a first fault status signal representing a detected sensor fault of the predetermined fault type.

19. The circuit of claim 18, including means for processing the sensor return signals to provide sensor information.

20. The circuit of claim 18, wherein the fault detection means includes means for receiving a fault status signal from the fault detection means and providing a fault status indicator representing a detected fault type.

21. The circuit of claim 18. including means for providing a sensor supply voltage at a sensor supply terminal of the circuit.

22. The circuit of claim 18, wherein the IC includes means for coupling a respective sensor.

23. The circuit of claim 18, wherein the IC includes means for receiving a control signal and means for coupling a selected one of the means for coupling a respective sensor to the means for converting in response to the control signal.

24. A controller integrated circuit (IC), comprising:
a driver to drive a first domain sensor source voltage to a sensor supply terminal of the IC;
a receiver to capture sensor return signals at a sensor input terminal of the IC;
a fault detection system to convert the sensor return signals from a sensor voltage domain to an IC voltage domain and detect a predetermined fault types based on comparisons of the converted signals with IC domain reference voltages representative of the predetermined fault types occurring at a sensor in the sensor voltage domain;
a fault controller to receive fault status signals from the fault detection system and output fault status indicators representing detected fault types;
wherein operating voltages for the sensor return signals in the sensor voltage domain exceed operating voltages for the corresponding converted signals in the IC voltage domain; and
wherein the fault detection system includes a plurality of fault detection circuits, each fault detection circuit of the plurality of fault detection circuits comprising:
a first level shifter to receive a reference input signal from the sensor voltage domain and to generate a trigger signal in the IC voltage domain;
a second level shifter to receive the sensor return signals from the sensor voltage domain and to generate level shifted sensor signals within the IC voltage domain; and
a comparator to compare the level shifted sensor signals to the trigger signal, wherein the comparator generates a first fault status signal representing a detected predetermined sensor fault.

25. The circuit of claim 24, wherein the first level shifter and the second level shifter are high voltage devices compared to the IC voltage domain.

26. The circuit of claim 24, wherein the first level shifter includes a programmable voltage divider network to generate the trigger signals.

27. The circuit of claim 24, wherein the second level shifter includes a programmable voltage divider network to generate the level shifted sensor signals.

28. The circuit of claim 24, wherein the fault controller determines if the sensor input terminal is disconnected from the sensor.

29. The circuit of claim 24, wherein the IC further comprises:
- multiple sensor input terminals, each for coupling to a respective sensor; and
- a multiplexer coupling the fault detection system to a selected one of the sensor input terminals in response to a control signal.

30. The circuit of claim 24, wherein the IC further comprises a decoder to process the sensor return signals.

* * * * *